United States Patent
Jones et al.

(10) Patent No.: US 9,357,668 B2
(45) Date of Patent: May 31, 2016

(54) POWER MANAGEMENT SYSTEMS

(71) Applicant: Moog Inc., East Aurora, NY (US)

(72) Inventors: Franklin B. Jones, Shrewsbury, MA (US); Stuart A. Jones, Duxbury, MA (US); Andrew I. Nehring, Northborough, MA (US); Daniel Jones, Northborough, MA (US)

(73) Assignee: Moog Inc., East Aurora, NY (US)

( * ) Notice: Subject to any disclaimer, the term of this patent is extended or adjusted under 35 U.S.C. 154(b) by 159 days.

(21) Appl. No.: 13/904,428

(22) Filed: May 29, 2013

(65) Prior Publication Data

US 2013/0322016 A1    Dec. 5, 2013

Related U.S. Application Data

(60) Provisional application No. 61/653,141, filed on May 30, 2012.

(51) Int. Cl.
*H05K 7/20* (2006.01)
*H05K 7/14* (2006.01)
*H05K 13/00* (2006.01)

(52) U.S. Cl.
CPC ............ *H05K 7/1432* (2013.01); *H05K 7/1454* (2013.01); *H05K 13/00* (2013.01); *Y10T 29/49117* (2015.01)

(58) Field of Classification Search
CPC ... H05K 7/1432; H05K 7/1454; H05K 13/00; H05K 7/20936
USPC ............ 361/679.01, 688, 689, 699, 728, 856
See application file for complete search history.

(56) References Cited

U.S. PATENT DOCUMENTS

| | | | |
|---|---|---|---|
| 6,307,742 B1 | 10/2001 | Diaz | |
| 7,365,973 B2 * | 4/2008 | Rasmussen et al. | 361/694 |
| 7,394,660 B2 | 7/2008 | Hidaka | |
| 7,499,286 B2 | 3/2009 | Berke | |
| 7,864,519 B2 | 1/2011 | Lin et al. | |
| 8,910,369 B2 * | 12/2014 | Herbsommer et al. | 29/592.1 |
| 2007/0258219 A1 | 11/2007 | Howes et al. | |
| 2011/0013364 A1 | 1/2011 | Howes et al. | |

FOREIGN PATENT DOCUMENTS

| | | |
|---|---|---|
| JP | 2007129861 | 5/2007 |
| JP | 2010051071 | 3/2010 |
| JP | 2011211847 | 10/2011 |
| WO | 2011008514 | 1/2011 |

OTHER PUBLICATIONS

International Search Report and Written Opinion in related International Patent No. PCT/US2013/043049, mailed on Aug. 27, 2013; 10 pages.

* cited by examiner

*Primary Examiner* — Bernard Rojas
(74) *Attorney, Agent, or Firm* — Hodgson Russ LLP (57) ABSTRACT

Provided are a power management system and method. At least one frame module includes at least one bay and a plurality of first connectors at a rear portion of the at least one bay and at least one power conversion unit positioned in the at least one bay. The at least one power conversion unit includes a plurality of second connectors. Each second connector is removably coupled to a first connector of the plurality of first connectors. The first and second connectors include a combination of high power, cooling, and control connectors.

15 Claims, 14 Drawing Sheets

POWER MANAGEMENT SYSTEMS

CROSS-REFERENCE TO RELATED APPLICATIONS

This application claims the benefit of U.S. provisional patent application No. 61/653,141 filed on May 30, 2012 and entitled "Power Management Systems", the content of which is incorporated by reference in its entirety.

FIELD OF THE INVENTION

The present invention relates generally to intelligent power management systems.

BACKGROUND OF THE INVENTION

Conventional electronic drives and control systems can provide a multitude of functions, such as DC-to-AC power inversion, AC-DC rectification, DC-DC conversion, and power balancing, for delivering power on demand according to application-specific needs.

SUMMARY OF THE INVENTION

In accordance with an aspect, provided is a system that includes a power conversion unit coupled to a frame module. The power conversion unit includes a plurality of high power, cooling, and control male and/or female connectors that interface with corresponding male and/or female connectors at the frame module. In this manner, the power conversion unit can be removed from or inserted into the frame module, whereby each and every connector at the power conversion unit mates with a corresponding connector at the frame module, reducing the risk of human error with respect to connectivity, for example, misaligning AC power connectors.

In accordance with an aspect, provided is a power management system, comprising: at least one frame module including at least one bay and a plurality of first connectors at a rear portion of the at least one bay and at least one power conversion unit positioned in the at least one bay. The at least one power conversion unit includes a plurality of second connectors. Each second connector is removably coupled to a first connector of the plurality of first connectors. The first and second connectors include a combination of high power, cooling, and control connectors.

In accordance with an aspect, provided is a method for delivering power, comprising: arranging a plurality of power conversion units in a frame, the frame comprising a plurality of first connectors, the power conversion units each comprising a plurality of second connectors; and simultaneously connecting the plurality of second connectors to a first connector of the plurality of first connectors, wherein the first and second connectors include a combination of high power, cooling, and control connectors.

BRIEF DESCRIPTION OF THE DRAWINGS

The above and further advantages of this invention may be better understood by referring to the following description in conjunction with the accompanying drawings, in which like numerals indicate like structural elements and features in the various figures. The drawings are not meant to limit the scope of the invention. For clarity, not every element may be labeled in every figure. The drawings are not necessarily to scale, emphasis instead being placed upon illustrating the principles of the invention.

DETAILED DESCRIPTION OF THE INVENTION

The present inventive concepts include a modular, rack-in power conversion unit comprising a plurality of power, control, and coolant connections that can be plugged into a power system frame module with a single, cam-assisted, insertion motion. The power conversion unit can provide features related to power modification such as AC-DC rectification, inversion such DC to AC power inversion, DC-DC conversion, and/or power balancing.

Figure 1:
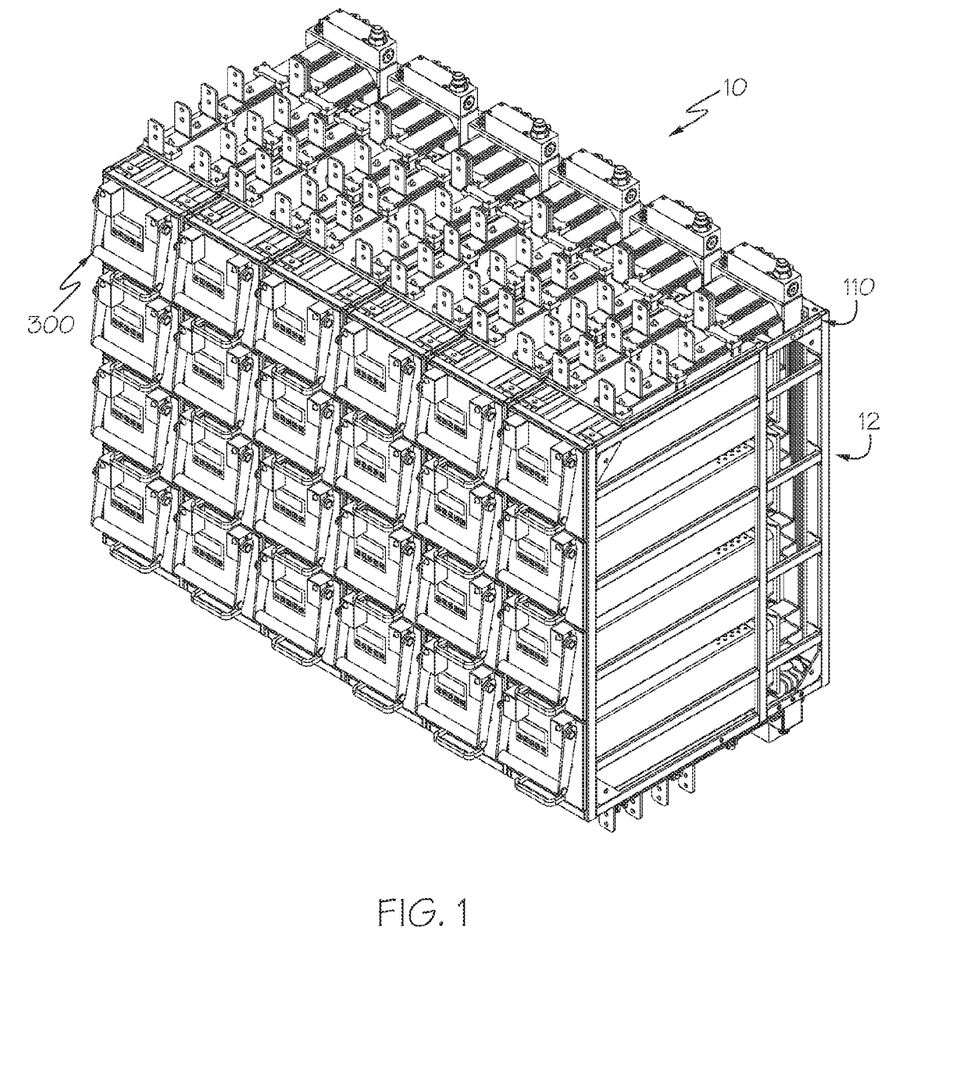
FIG. 1 is a perspective view of a power management system, in accordance with an embodiment.

FIG. 1 is a perspective view of a power management system 10 including a plurality of power conversion units 300 positioned in a frame 12, in accordance with an embodiment. The power management system 10 can provide one or more functions, such as DC-to-AC power inversion, AC-DC rectification, DC-DC conversion, and power balancing, for delivering power on demand according to application-specific needs. For example, the power management system 10 can be at least part of a system for converting DC power from a battery bank, fuel cell, or other power source to grid-synchronized AC power.

The system 10 can be constructed and arranged to include an array of power conversion units 300, which can be removably positioned in one or more bays at the frame 12 in a manner that reduces development and installation time, described below. The power conversion units 300 can be identical, or can be different from each other. The power conversion units 300 can provide one or more functions, depending on deployment in the system, for example, DC to AC power inversion and so on.

The frame 12 can be constructed and arranged as a rack, array, or related modular structure, allowing for modularity and an expandable architecture, for example, permitting the system 10 to scale according to user-defined power requirements. Power requirements can be satisfied on demand according to application-specific needs, by inserting additional power conversion units 300 into available bays at the frame 12, or by removing power conversion units 300 from the system 10.

Figure 2:
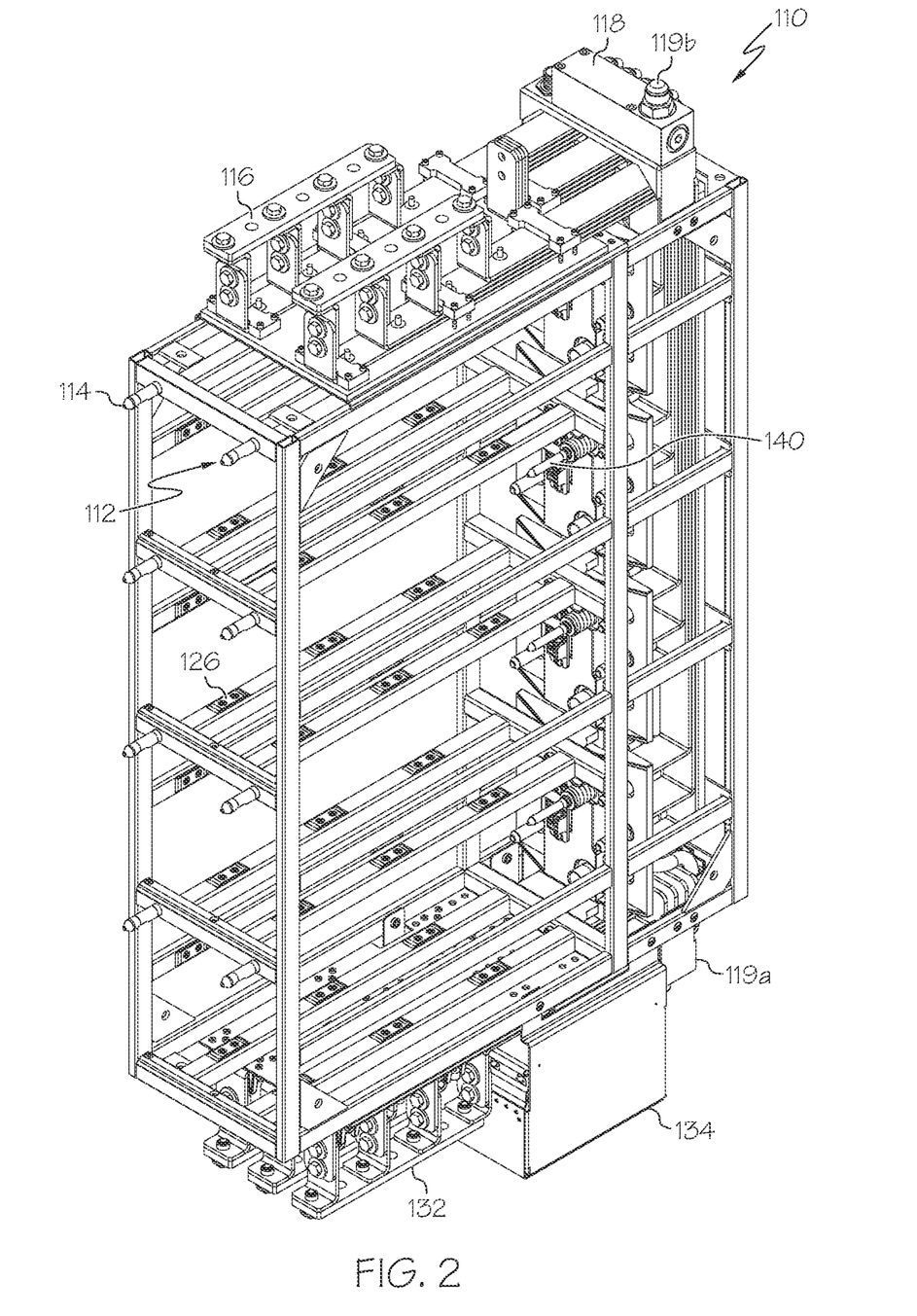
FIG. 2 is a perspective view of a frame module, in accordance with an embodiment.

The frame 12 can include a plurality of frame modules 110, for example, shown in FIG. 2, which, when coupled together, form an array of partitioned bays 112, each bay 112 constructed and arranged to receive at least one power conversion unit 300. The frame modules 110 can each be coupled to a power frame (not shown) that transfers AC and/or DC-related power to/from the frame modules 110. The frame 12 can also include system level components such as a filter assembly, I/O devices, coolant pipes, control cables, and/or other communication elements permitting the electronic or other physical exchange between power conversion units 300 positioned in their bays 112 and/or devices external to the system 10. For example, the communication elements can establish a communication between the power, cooling, and control connectors of each of the frame modules 110 and/or external devices such as coolant supplies, external controllers, power sources or receivers, and so on.

FIG. 2 is a perspective view of a frame module 110, in accordance with an embodiment. The frame module 110 can include a plurality of bays 112, for example, a column of four bays 112 as shown in FIG. 2, each constructed and arranged to receive a power conversion unit 300.

Each frame module 110 includes one or more drawer slide assemblies 126, cooling components, piping valves, cabling, bus work and electrical connectors, and/or other elements permitting the performance of an operation of the module 110. Other optional components can include but not be limited to doors, ventilation elements, and so on.

Figure 8:
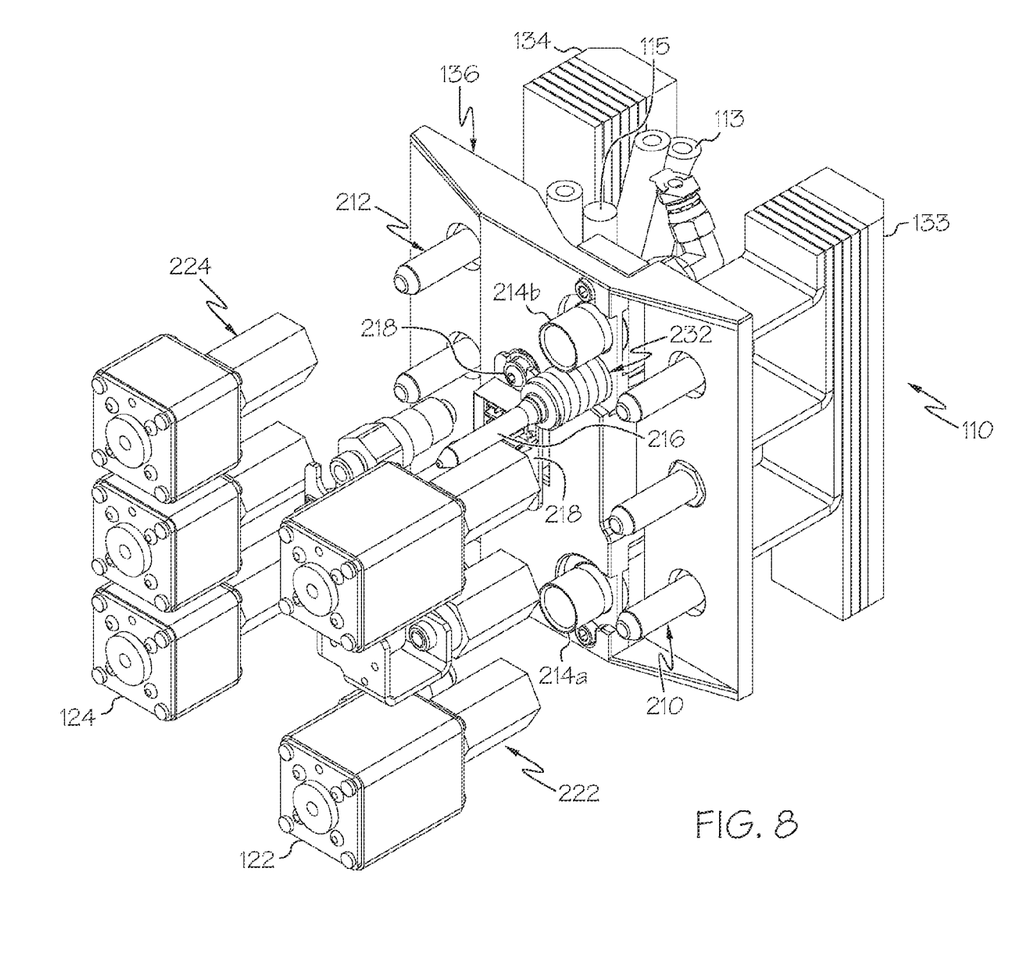
FIG. 8 is an exploded perspective view of a power conversion module and a frame module of power management system, in accordance with an embodiment.

A frame module 110 when removably coupled to the power conversion unit 300 can include a blindmate interface comprising a set of connectors 140 which include, for example, one or more connectors 210, 212, 214, 216, and/or 218 shown in FIG. 8. The blindmate interface allows for one or more power conversion units 300 to be installed and removed quickly and safely, by eliminating the need to manually attach high voltage and high current connections. The system 10 can be prevented from operating when not connected to cooling system, safety ground, or control communications, which reduces the chances of damaging equipment through improper installation.

The frame module 110 can include a capacitor bank 134 electrically connected to an AC bus bar 133 and/or a DC bus bar 134, for example, shown in FIG. 8, and can perform functions such as filtering noise, power conditioning, or the like with respect to signals exchanged between the frame module 110 and other frame modules 110 of the system 10 and/or devices external to the system 10.

The frame module 110 can include a first power input/output (I/O) module 132 for exchanging power, for example, AC power, between the frame module 110 and external devices. The I/O module 132 can be coupled to the installation level AC bus. If the input includes AC-related power, it flows from an input of the I/O module 132 through the bus bar 133 to the connectors 210 and into the module. If an output includes AC-related power, the abovementioned flow is the opposite that of the input. Similar flows can be established with respect to DC-related power and the I/O module 116.

The frame module 110 can include a second power input/output (I/O) module 116 for exchanging power, for example, DC power, between the frame module 110 and external devices. The first and second power I/O modules 132, 116 can provide an AC/DC power conversion function.

The frame module 110 can include a coolant manifold 118 having a coolant input interface 119a and a coolant output interface 119b. During operation, coolant can enter the input interface 119a from a coolant source. The coolant can circulate through the power conversion modules 300, for example, in a manner described herein, and output from the output interface 119b to a radiator or related device, then to a reservoir or the like, where the coolant can be subsequently removed by a pump, then filtered. The filtered coolant can be input to the frame, for example, recirculated to the input 119a.

Figure 3:
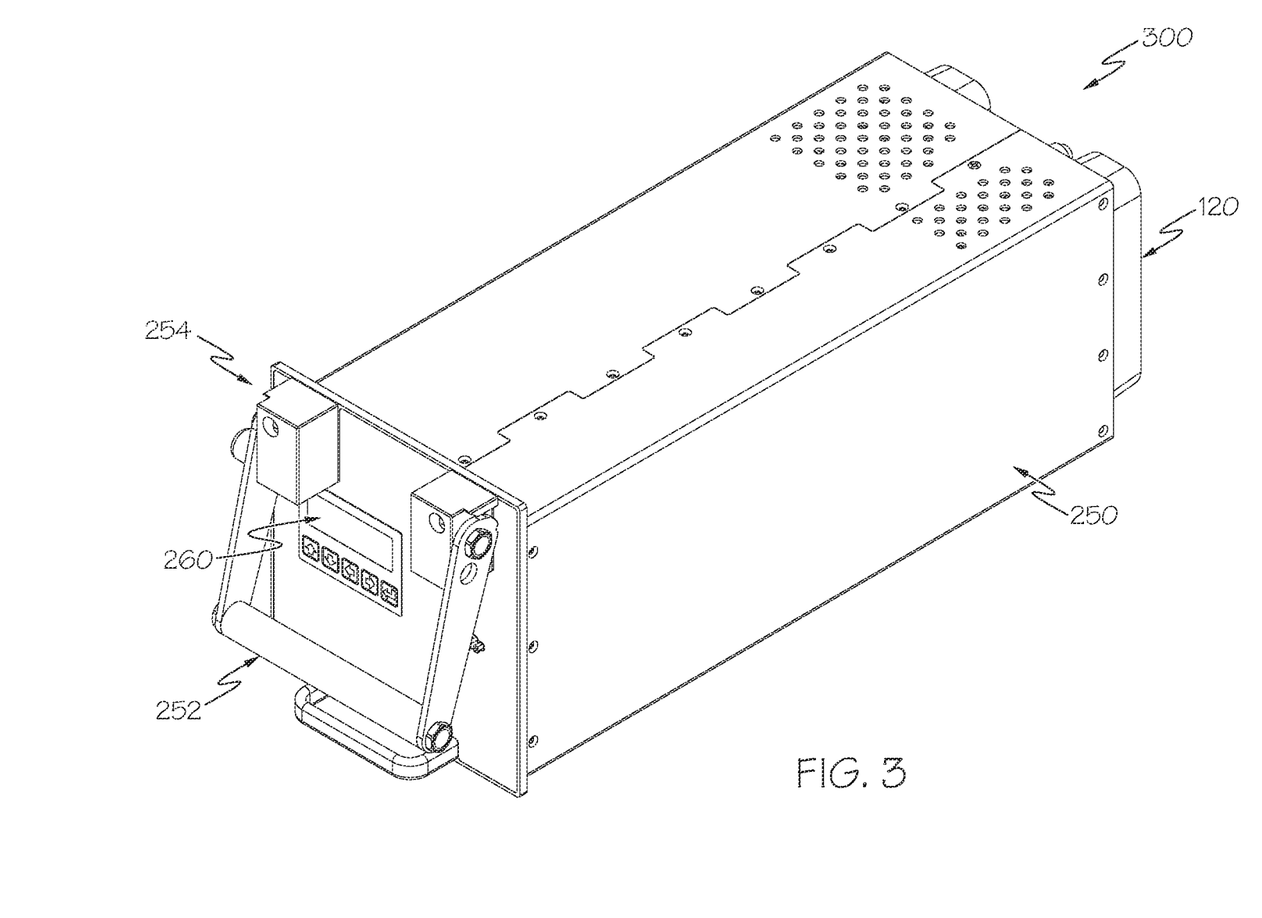
FIG. 3 is a perspective view of a power conversion unit, in accordance with an embodiment.

FIG. 3 is a perspective view of a power conversion unit 300, in accordance with an embodiment. As described above, the power conversion unit 300 is constructed and arranged for positioning in a bay 112 of the frame 12, for example, shown in FIG. 1.

The power conversion unit 300 can include a housing 250, a cam assembly 254, a display 260, a cam action lever 252, and a power conversion module 120. FIG. 3 can include other components that are positioned under the housing 250, for example, shown and described with respect to FIGS. 4A-4D, for example, a capacitor bank, DC and AC connections, and so on. The housing 250 can be removed to expose these components.

The cam assembly 254 can be controlled by the handle 252, for example, rotated by the handle 252 when the handle 252 is moved up and down. Here, the cam assembly 254 can be positioned about pins 114 extending from the frame 110. The power conversion unit 300 can be locked in place in the bay 112 of the frame module when the handle 252 is in one position whereby the cam assembly 254 is locked about the pins 114. The power conversion unit 300 can be removed from the bay 112 when the handle 252 is in another position, whereby the cam assembly 254 does not apply a force about the pins 114.

The display 260 can display information local to the power conversion unit 300 such power readings, for example, a current voltage or current, or other status information. The display 260 can display diagnostics, help information, or other information to assist a reader with determining a state of the power conversion unit. Other examples can include internal temperature readings, communication rates, and/or other information readily known to those of ordinary skill in the art.

The power conversion module 120 can perform power conversion, inversion, rectification, or a combination thereof, and/or related power-related functions. The power conversion module 120 includes a blindmate interface having a set of connectors that mate with the connectors 140 at a rear portion of the frame module 110. Thus, when the power conversion unit 300 is inserted to the frame module 110, upon plug-in, the blindmate interface between the frame connectors 140 and the power conversion module connectors 120 simultaneously or near-simultaneously establishes DC and AC power connections, control and communication, and cooling flow.

Figure 4A:
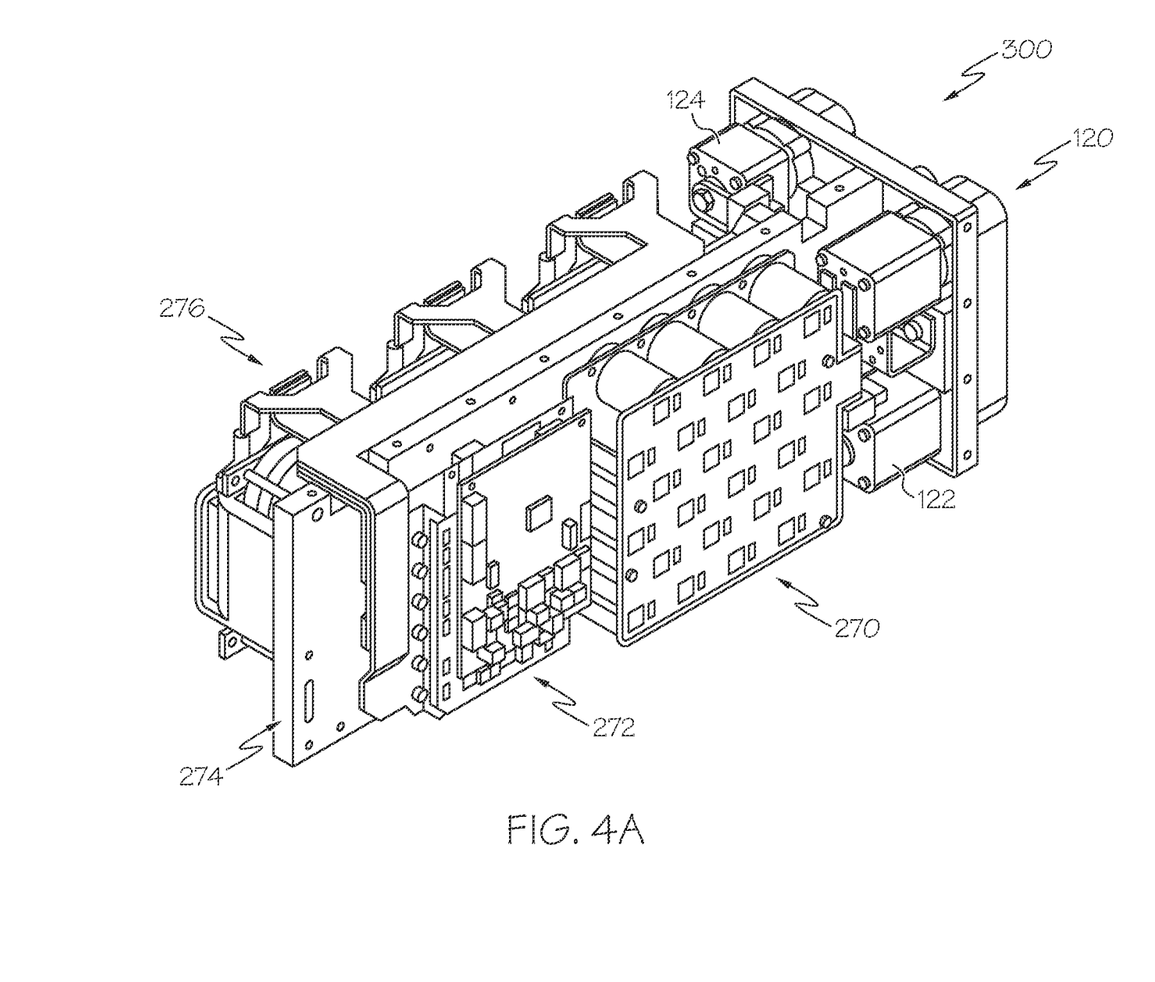
FIG. 4A is a perspective view of an interior of the power conversion unit of FIG. 3, in accordance with an embodiment.
Figure 4B:
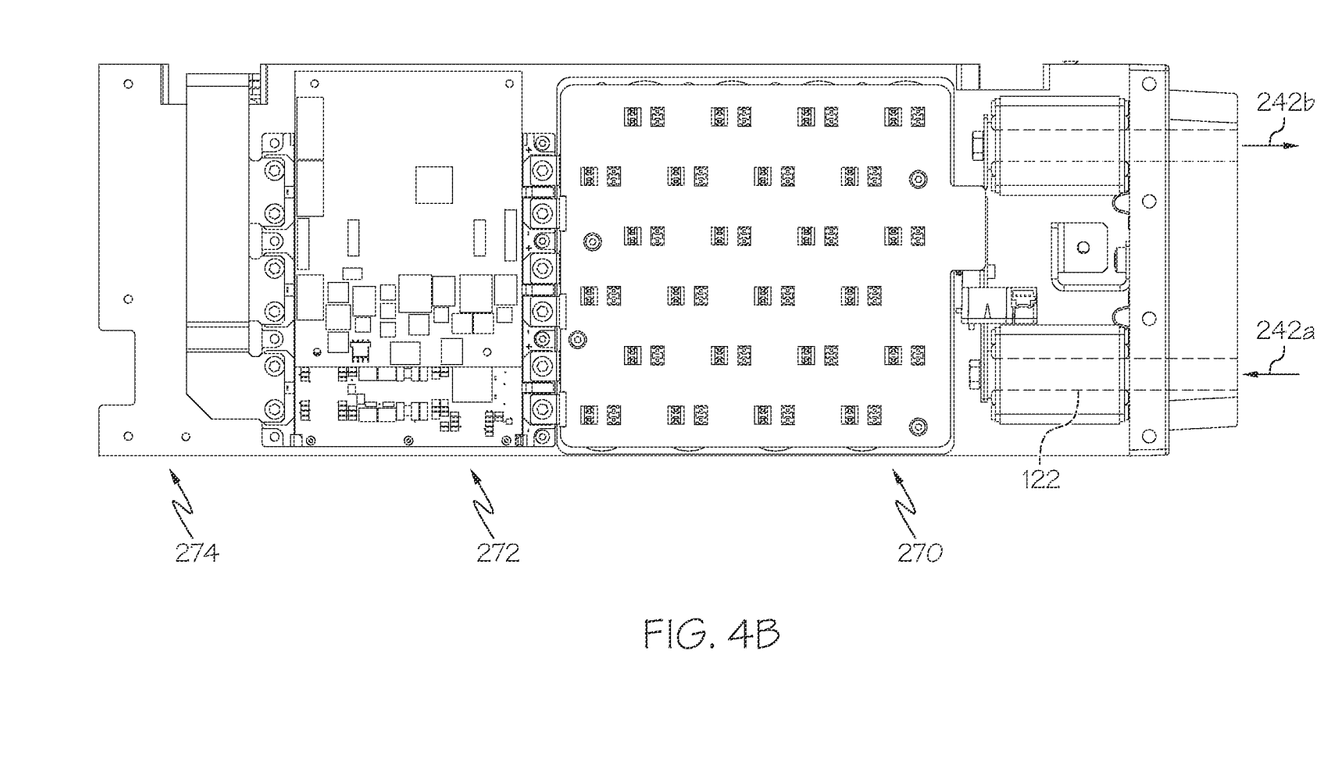
FIG. 4B is a side view of the power conversion unit of FIGS. 1, 3, and 4A.
Figure 4C:
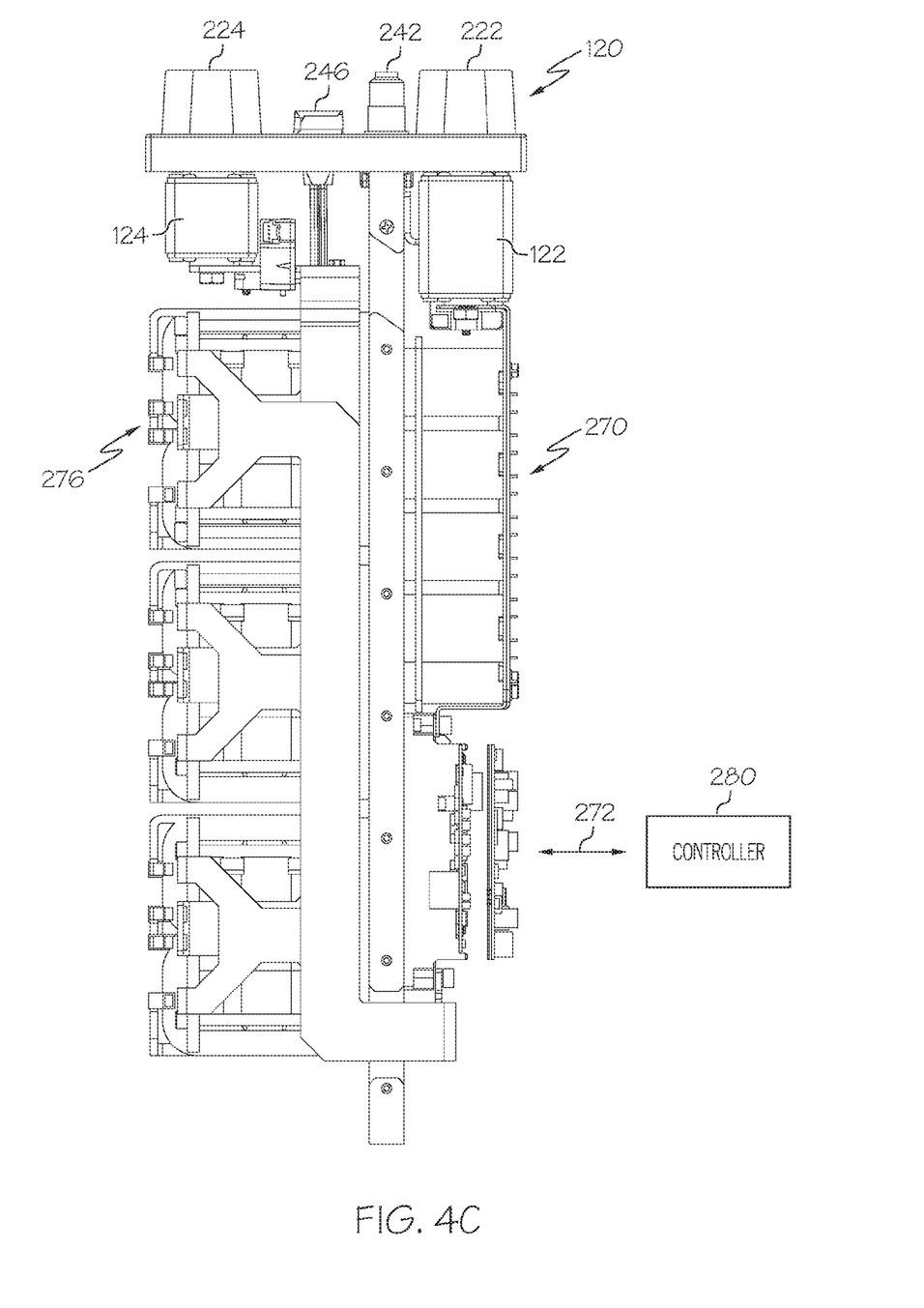
FIG. 4C is a top view of the power conversion unit of FIGS. 1, 3, 4A, and 4B.
Figure 4D:
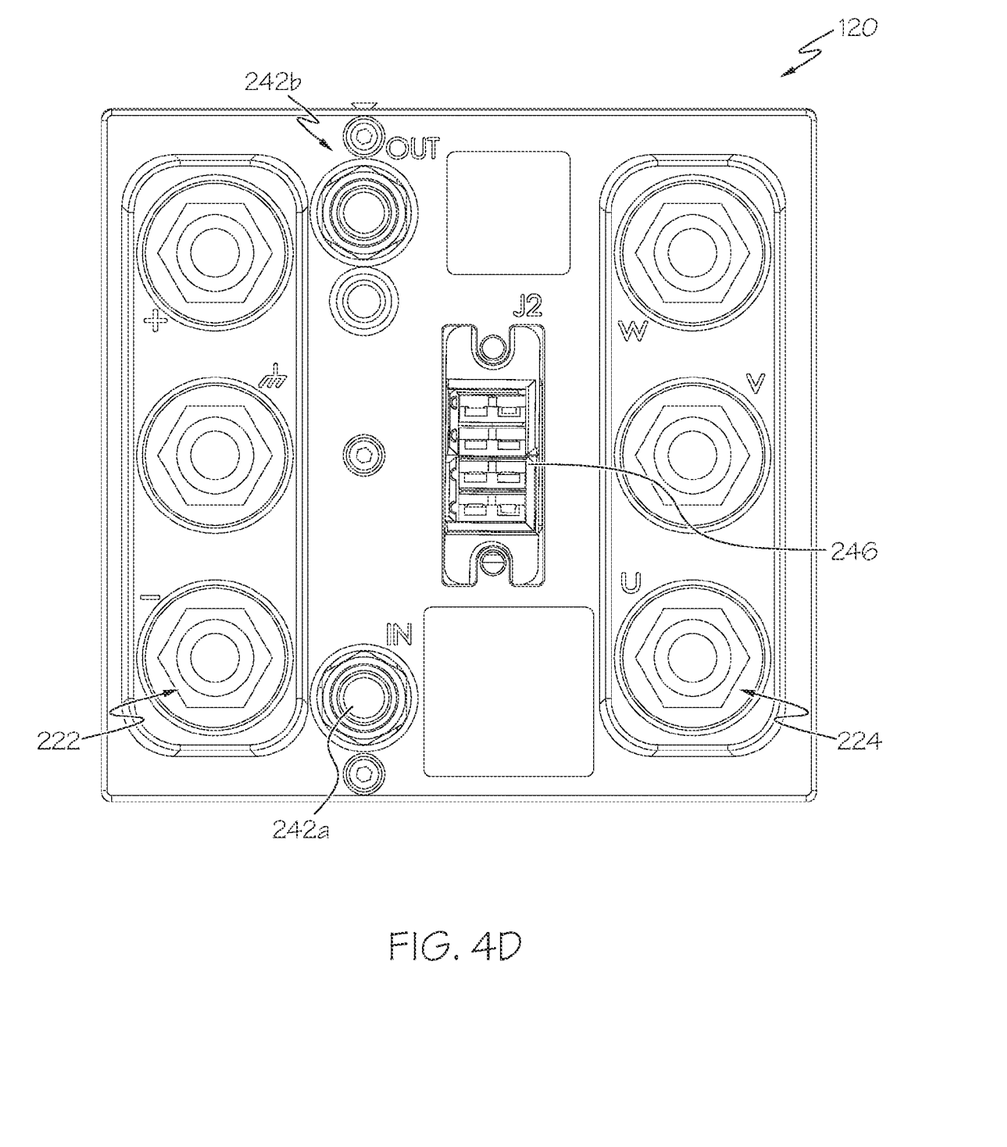
FIG. 4D is a rear view of the power conversion unit of FIGS. 1, 3, and 4A-4C.

FIG. 4A is a perspective view of an interior of the power conversion unit 300 of FIG. 3, in accordance with an embodiment. FIG. 4B is a side view of the power conversion unit of FIGS. 1, 3, and 4A. FIG. 4C is a top view of the power conversion unit 300 of FIGS. 1, 3, 4A, and 4B. FIG. 4D is a rear view of the power conversion unit 300 of FIGS. 1, 3, and 4A-4C. The housing 250 shown in FIG. 3 is removed to expose the interior of the power conversion unit 300.

As shown in FIGS. 4A-4D, the power conversion unit 300 includes a switching module 272, as well as its associated driver and control circuitry. The switching module 272 can participate in a bi-directional communication with a central controller 280 that can process information received from one or more power conversion units 300 and/or other system elements of the system 10. The central controller 280 can present control, feedback, status information, or a combination thereof, to one or more of the power conversion units 300 and/or other system elements of the system 10. In another embodiment, the system 10 communicates with one or more central controllers 280.

The switching controller 272 can provide synchronized switching over a communication network, for example, a network that includes a proprietary or standards-based protocol for establishing a transfer of signals between the system 10, more specifically, power conversion units 300 of the system 10, and/or one or more controllers 280.

The power conversion unit 300 includes a plurality of AC connectors 224, a plurality of DC connectors 222, a capacitor bank 270 and an inductor bank 276.

The capacitor bank 270 can be coupled between the switching module 274 and a DC region of the power conversion module 120, for example, as shown in FIG. 4B, a set of DC fuses 122. The capacitor bank 270 can filter DC-related signals exchanged between the power conversion unit 300 and the frame module 110.

Figure 4E:
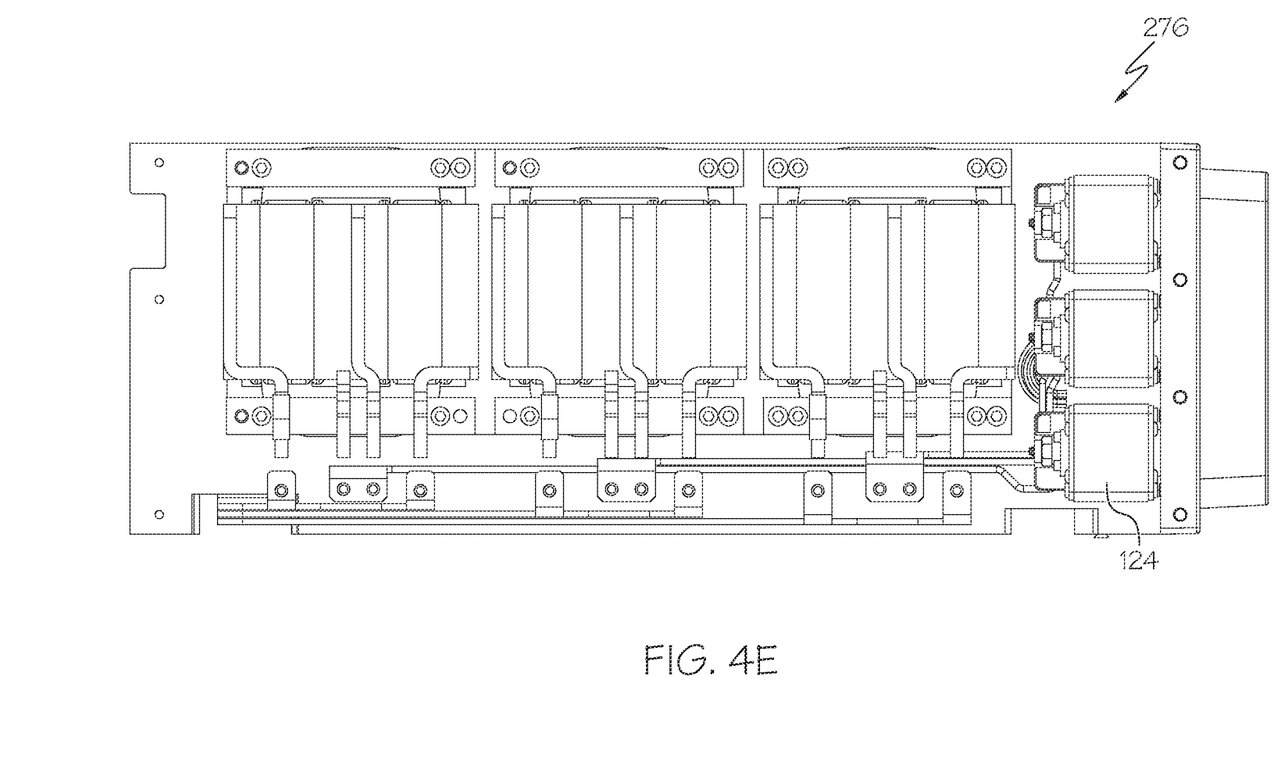
FIG. 4E is a view of an inductor region of the power conversion unit of FIGS. 1, 3, and 4A-4D.

As shown in FIGS. 4A and 4E, the inductor bank 276 can be positioned on an opposite side of a heat sink 274 as the capacitor bank 270 and/or the switching module 272. The inductor bank 276 can be adjacent an AC region of the power conversation module 120, for example, adjacent a set of AC fuses 124 as shown in FIGS. 4A, 4C, and 4E. The inductor bank 276 can reduce high frequency currents between the between the power conversion unit 300 and the frame module 110. The heat sink 274 can be a liquid cooled or air cooled heat sink 274, which dissipates heat generated at the power conversion unit 300.

Another feature is that the required system capacitance and inductance is provided at a modular level, for example, at the power conversion units 300, for example shown at FIGS. 4A-4E. These parameters can be scaled to a system size by spreading it among the power converter units 300 instead of building capacitors and inductors to match the completed installation. For example, each power conversion module 300 includes a DC bank and an AC bank, allowing a system to be scaled up or down depending on power requirements or the like. This allows for a fully scalable system; otherwise, every installation would require custom development and fabrication. Conventional systems, on the other hand, have centralized DC and AC banks, requiring units to be configured in a unique manner for each deployment. The inductors, for example, can be between the switching module 272 and an AC input 116, for allowing the modules to control current individually. The switching module 272 can therefore synchronize switching at the module to prevent or mitigate any undesirable exchange of current between other parallel modules.

In an embodiment, the power conversion unit 300 includes current sensors and individual current control loops (not shown) that can switch insulated gate bipolar transistors or related switching elements to maintain a current balanced between power conversion units 300. This feature can allow for individual power conversion units 300 to scale back their current if they are overheating.

Figure 5:
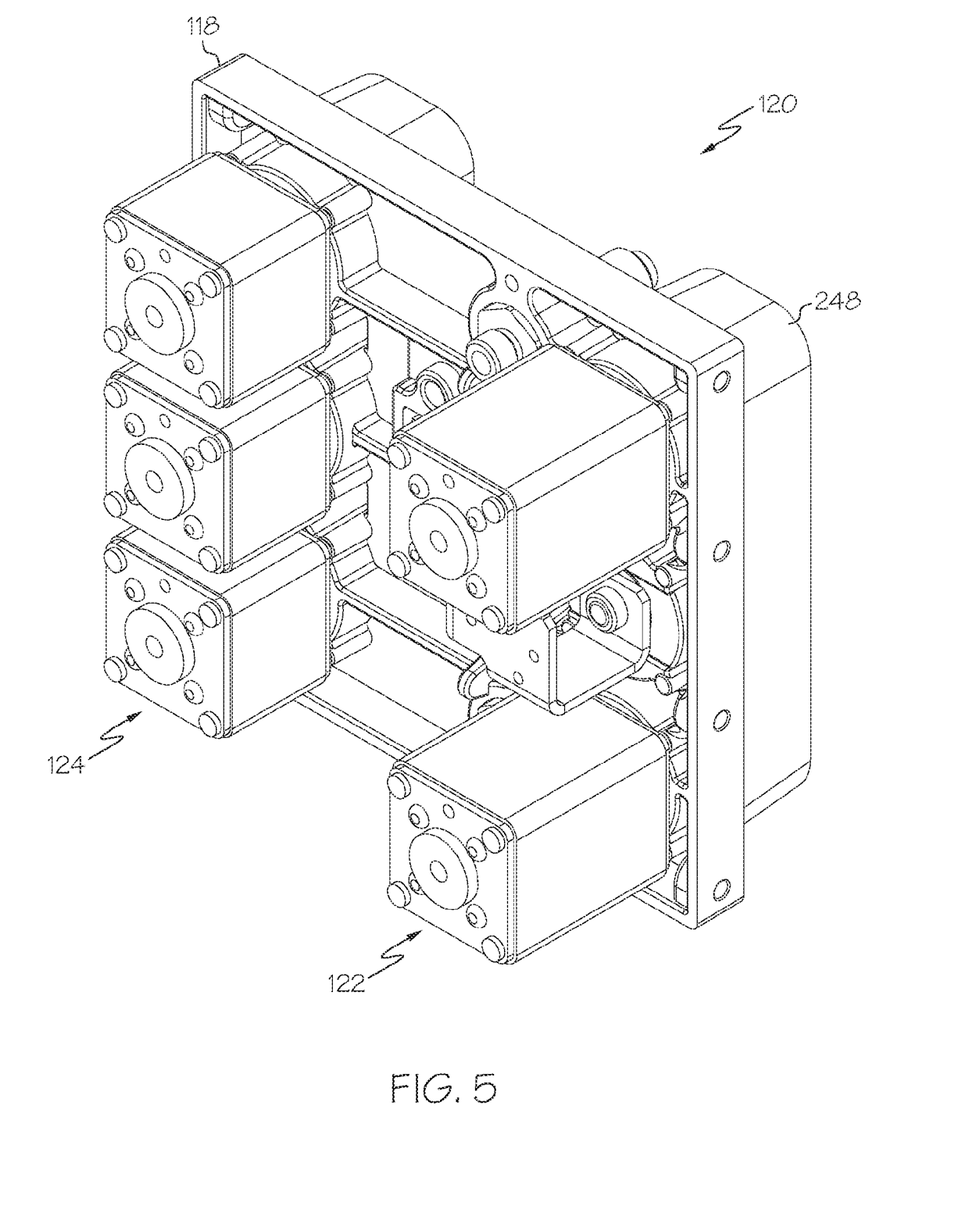
FIG. 5 is a perspective view of the power conversion module of FIGS. 3 and 4.
Figure 6:
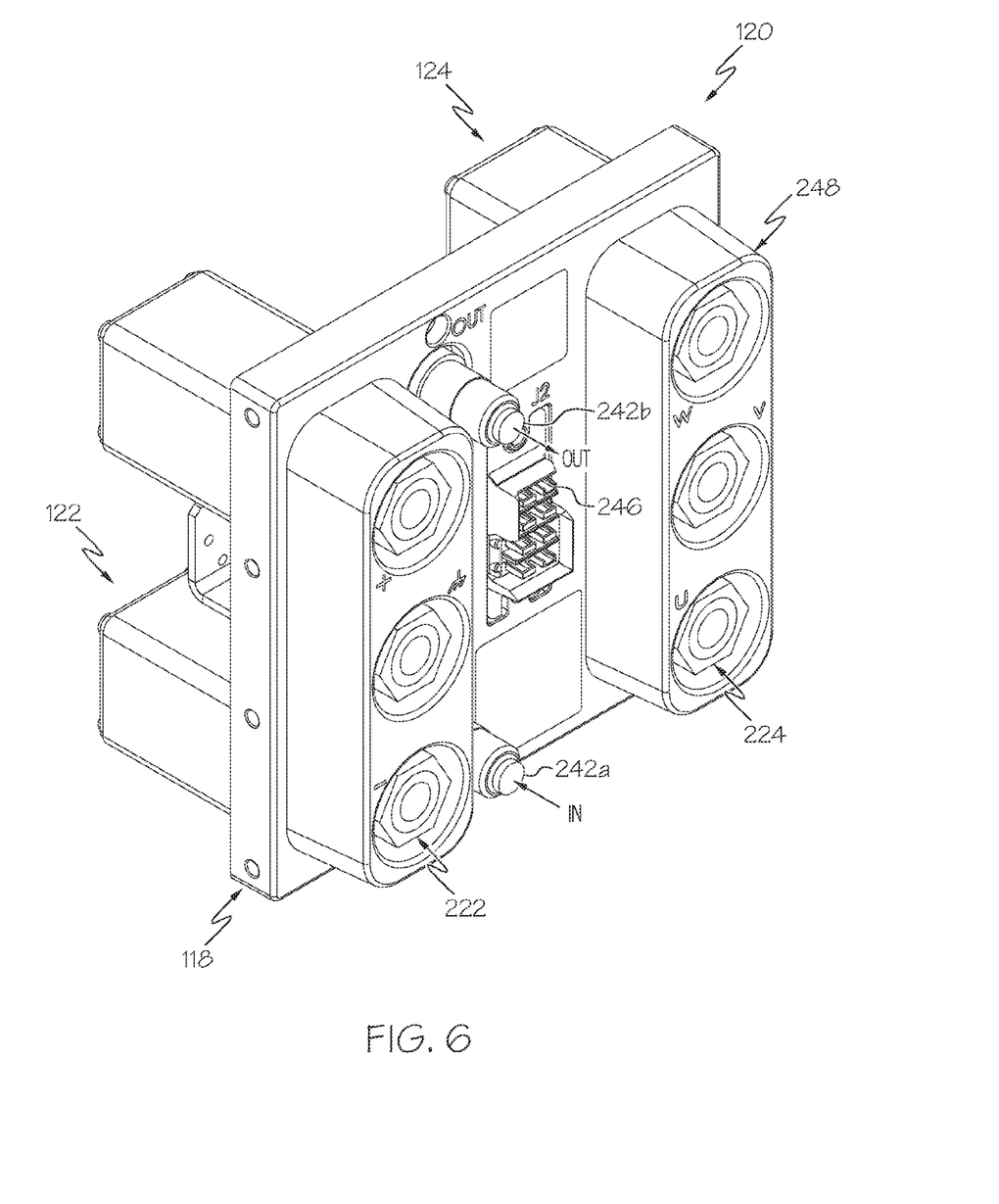
FIG. 6 is another perspective view of the power conversion module of FIGS. 3-5.
Figure 7:
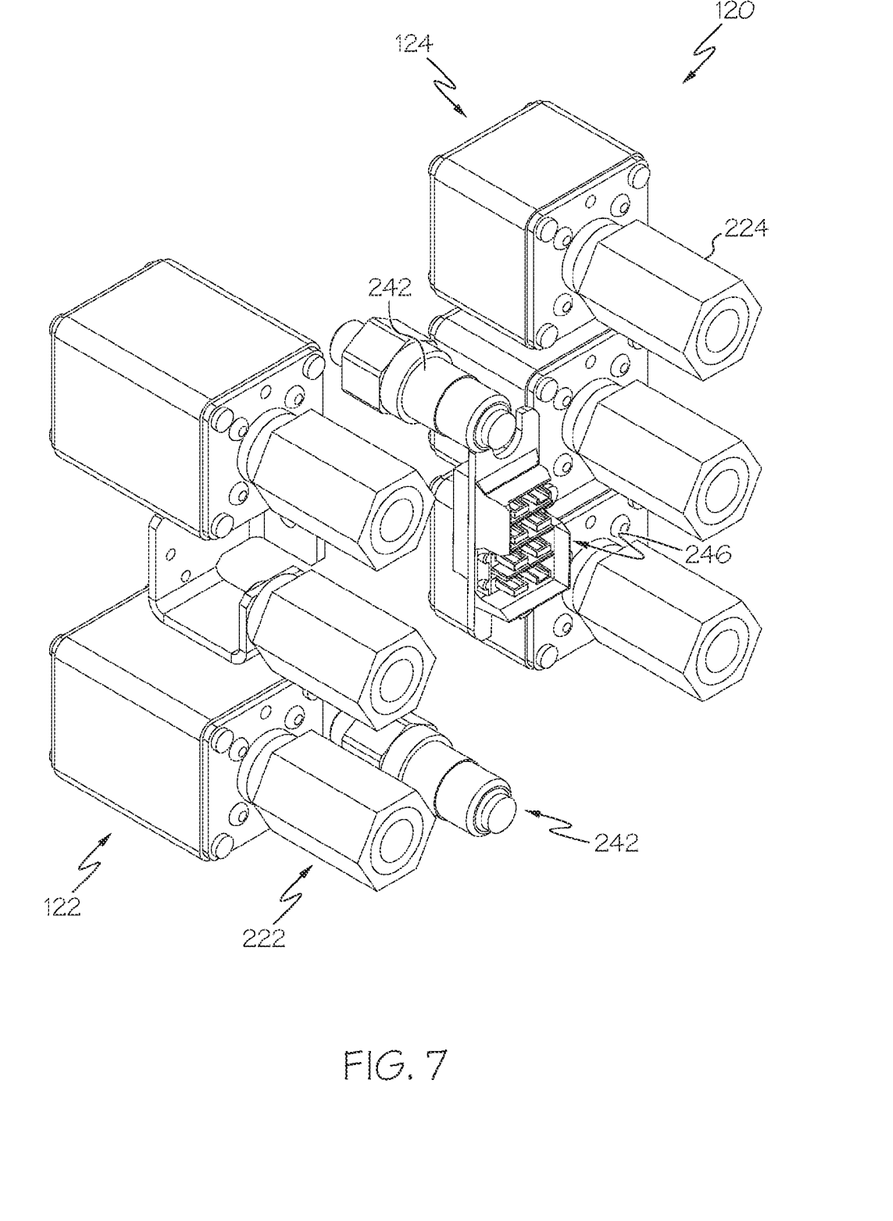
FIG. 7 is an exploded perspective view of a rear region of the power conversion module of FIGS. 3-6.

FIG. 5 is a perspective view of the power conversion module 120 of FIGS. 3 and 4. FIG. 6 is another perspective view of the power conversion module 120 of FIGS. 3-5. FIG. 7 is an exploded perspective view of a rear region of the power conversion module 120 of FIGS. 3-6.

The power conversion module 120 includes a set of DC fuses 122 and a set of AC fuses 124. The AC fuses 124 can each be coupled to an AC power connector 224. The DC fuses 122 can each be coupled to a DC power connector 222. As shown in FIG. 4D, the AC and DC power connectors 222, 224 can be female connectors, and can be floating or flexible power connectors. The floating AC and DC power connectors 222, 224 can be constructed and arranged for removably conductive coupling with male connectors 140 at a rear portion of the frame module 110.

The AC fuses 122 and DC fuses 124 can be coupled to one side of an insulator 118 and the floating power connectors 222, 224 can be coupled to another side of the insulator 118. Electrical paths can be formed between the fuses 122, 124 and their counterpart connectors 222, 224. The insulator 118 can include holes so that the floating power connectors 222, 224 can extend through to one or more connector shrouds 248 coupled to the opposite side of the insulator 118 as the fuses 122, 124. The shrouds 248 can surround the sidewalls of the connectors 222, 224, and be of a width that is longer than that of the connector sidewalls for protecting the connectors 222, 224. The shrouds 248 include openings for exposing an interface of the connectors 222, 224 for receiving male power connectors 210, 212, respectively, extending from the frame module 110, shown for example in FIG. 9.

As shown in FIG. 6, the power conversion module 120 can include coolant connectors 242a, 242b that provide a coolant input and output, respectively. When the power conversion unit 300 is inserted in a frame module 110, a coolant flow path is formed from a coolant input interface 119a of the coolant manifold 118 of the frame module 110 (see FIG. 2) to the coolant input connector 242a of the power conversion module 120, then about heat-generating components of the power conversion module 120 to the coolant output connector 242b to a coolant output interface 119b of the coolant manifold 118 of the frame module 110. In an embodiment, the coolant connectors 242a, 242b are male connectors and form part of a blind interface with floating coolant connectors 214a, 214b, respectively, and coolant hoses 113 of the frame module 110, for example, shown in FIG. 8.

As shown in FIG. 6, the power conversion module 120 can include a controller connector 246 that interfaces with a control connector 118 of the frame module 110, for forming a signal path between a control cable 115 of the frame module 118 (see FIGS. 8-10) and the switching module 272 of the power conversion unit 300. The control cable 115 can be coupled to a controller 280, which can synchronize elements of the system and exchange power commands, module feedback, device status, system diagnostics, and/or other control-related signals with the power conversion units 300.

Figure 9:
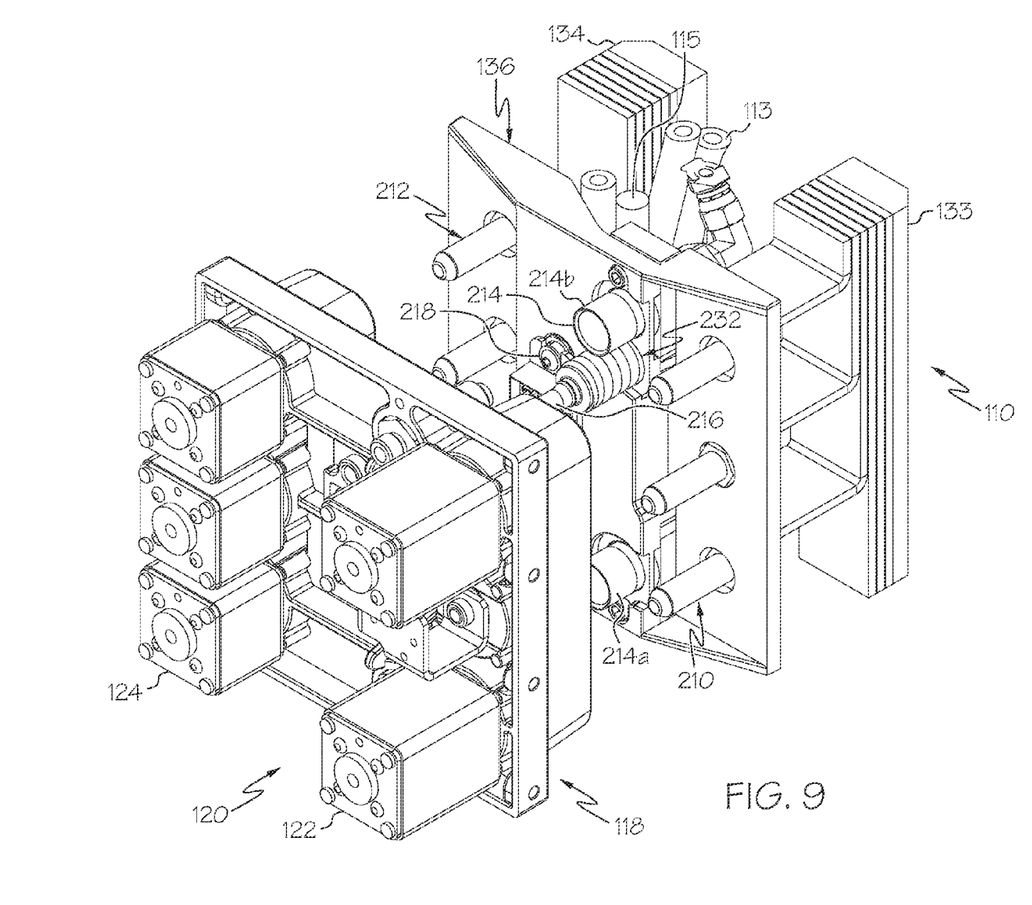
FIG. 9 is another exploded perspective view of the power conversion module and the frame module of FIG. 8.
Figure 10:
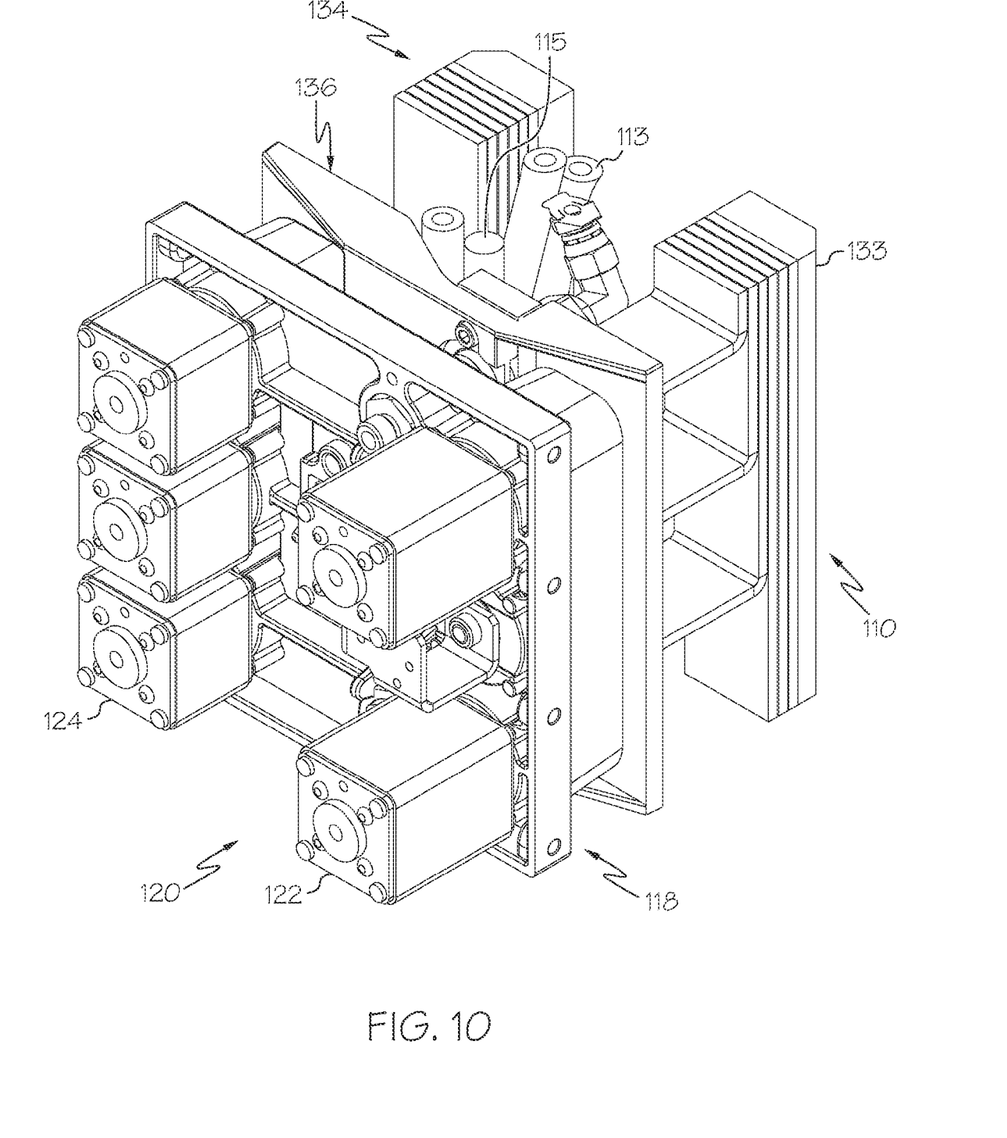
FIG. 10 is a perspective view of the power conversion module and the frame module of FIGS. 8 and 9 coupled to each other.

FIG. 8 is an exploded perspective view of a power conversion module 120 and a frame module 110 of a power management system, in accordance with an embodiment. FIG. 9 is another exploded perspective view of the power conversion module and the frame module of FIG. 8. FIG. 10 is a perspective view of the power conversion module and the frame module of FIGS. 8 and 9 coupled to each other. The power conversion module 120 and a frame module 110 can be elements of the power management system 10 described with reference to FIGS. 1-7. Elements of the power conversion module 120 and a frame module 110 are previously described herein and are not repeated for reasons related to brevity.

The frame module 110 comprises an AC bus bar 134 and/or a DC bus bar 133. One or more male AC power connectors 212 can be coupled to, and be in conductive communication with, the AC bus bar 134. For example, the AC power connectors 212 can be bolted to the AC bus bar 134. One or more male DC power connectors 210 can be coupled to, and be in conductive communication with, the DC bus bar 133. For example, the DC power connectors 210 can be bolted to the DC bus bar 133. One or more modules 120 can exchange power with the AC bus bar 134 and/or DC bus bar 133 via the DC power connectors 210 and the AC power connectors 212, respectively.

A connection alignment frame 136 can be positioned between the bus bars 133, 134 of the frame module 110 and the power conversion module 120. The frame module 110 can also include an alignment pin 216 that assists with aligning male and female power, cooling, and control connectors, respectively, and that can prevent a misalignment between the various connectors. The alignment frame 136 defines the spacings between the alignment pin 216 and the other connectors. The location of the alignment frame 136 is determined by the alignment pin 216. For example, when a power conversion unit 300 is inserted in a bay 112 of the frame module 110, the connection alignment frame 136 and the alignment pin 216 provide for the alignment of the male AC power connectors 212 of the frame module 110 and the female AC power connectors 224 of the power conversion unit 300, and aligns the male DC power connectors 210 of the frame module 110 and the female AC power connectors 222 of the power conversion unit 300. The frame module 110 can include an ejection spring 232 positioned about the alignment pin 216 that applies a force against the surface of the power conversion module 120 to assist in the disengagement of the various connections between the power conversion module 120 and the frame module 110 when the power conversion unit 300 is removed from the frame module 110.

As described above, the frame module 110 can include coolant connectors 214a, 214b that interface with male coolant connectors 242a, 242b, respectively, of the power conversion module 120 for circulating a coolant fluid such as a liquid and/or a gas throughout the power conversion unit 300. The frame module 110 can include one or more coolant tubes 113 in communication with the coolant manifold 118 described herein that can provide coolant fluid to, and/or remove coolant fluid from, the system 10.

The frame module 110 includes one or more control connectors 218 that can mate with a controller connector 246 of the power conversion module 120. The control connector 218 is in electronic communication with a control cable 115 of the frame module 118 for exchanging control signals with external electronic devices, such as the central controller 180 shown in FIG. 4C.

As shown in FIG. 8, the floating power connectors 224 are coupled to the AC fuses 122 and are each constructed and arranged for blindmate interfacing with a fixed AC power connector 212. Also, the floating power connectors 224 are coupled to the DC fuses 124 and are each constructed and arranged for blindmate interfacing with a fixed DC power blindmate connector 210. The floating coolant connector 214 is constructed and arranged for blindmate interfacing with a male coolant connector 242 at the power conversion module 120, for example, shown at FIGS. 6 and 7. The alignment pin 216 is constructed and arranged for blindmate interfacing with a bushing or related connector at the rear of the power conversion unit 300, for example, shown in FIG. 4D, can which can be aligned with, and can receive, the alignment pin 216. The control connector 218 is constructed and arranged for blindmate interfacing with the female control connector 246 at the power conversion module 120, for example, shown at FIGS. 6 and 7.

Thus, a mating connector set can provide for blindmate interfacing with one or more power conversion units 300. This feature all allows for power conversion units 300 to be installed and removed quickly, and safely, by eliminating the need to manually attach high voltage and high current connections. This feature also prevents the system 10 to operate when not connected to the cooling system, safety ground, or control communications, which reduces the chances of damaging equipment through improper installation. Also, since all required connections are established by a single insertion of the power conversion module 300, the risk of human error is reduced with respect to failing to establish a particular connection such as a coolant connection.

As described above, the present inventive concepts permit blind mate connections for power, control, and cooling. These connections can be made using fixed-float connection arrangements to create the required mechanical compliance. For example, a plurality of floating female DC power connectors 222 can receive a like plurality of fixed male DC power connectors 210. A female DC power connector 222 can move, or "wiggle" sufficiently to allow navigation of a corresponding male DC power connector 210. Thus, during insertion of the power conversion module 120, a misalignment of the DC power connectors 210, 222 with respect to each other can be corrected by permitting the female DC power connector 222 to receive a male DC power connector 210 even if the male DC power connector 210 is misaligned. Similarly, a plurality of floating female AC power connectors 224 can receive a like plurality of fixed male AC power connectors 212. Similarly, one or more floating female coolant connectors 214 can each receive a male coolant connector 242. Similarly, one or more female control connectors 246 can each receive a male control connector 218.

Another feature is that an insertion of a power conversion unit 300 can be performed at high power ranges. The systems in accordance with embodiments herein can accommodate power ranges in the area of 200 kW, with currents of up to 500 amps per connection and operating voltages of up to 1100 VDC or 690 VAC.

Another feature of the present inventive concepts is that the force required to make connections, as well as a positive lock on module position, is provided by the cam action lever 252. The separation of the male/female connections can be assisted by the module ejection spring 232. The modular configuration allows a power conversion unit 300 to be inserted and removed without the need for screwdrivers, wrenches or other tools.

As described above, another feature of the present inventive concepts is that the physical attachment, electrical contact, and coolant connections can all be made with a single motion, as distinguished from the bolted and/or latched connections used in conventional products.

The floating power connections, for example, at floating female DC power connectors 222, can be made by threading the corresponding male connector 210 directly to the DC fuse 124 through a clearance hole in the insulator 118. A male thread can be at the end of the female socket, which threads into the fuse. This simplifies module assembly, and reduces contact resistance in the system.

In an embodiment, each power conversion module 120 is capable of charging, or precharging, the DC bus 133 to an operating voltage, more specifically, modular precharging, to eliminate inrush current when main power is switched on. This reduces possible damage to capacitors and conductors, as well as eliminating the chances of blown fuses, tripped breakers, or other damaged power management systems at the installation level. A circuit in the switching module 272 is capable of charging or precharging a power bus, such as the DC bus 133.

The power conversion module can be reconfigured for different modes, for example, change its power conversion mode, i.e., DC-AC inverter, AC-DC rectifier (either active or passive), and/or DC-DC converter, according to signals received by an external controller (not shown) provided to the coupled control connectors. This allows for only one type of module to be used to fill all roles in the system.

What is claimed is:

1. A power management system, comprising:
   at least one frame module including at least one bay and a plurality of first connectors at a rear portion of the at least one bay; and
   at least one power conversion unit positioned in the at least one bay, the at least one power conversion unit including a plurality of second connectors, wherein each second connector is removably coupled to a first connector of the plurality of first connectors, wherein the first and second connectors include a combination of high power, cooling, and control connectors, and wherein the at least one power conversion unit comprises a housing, a cam assembly disposed on the housing, a display disposed on the housing, and a cam action lever disposed on the housing that is configured to control the cam assembly.

2. The power management system of claim 1, wherein the at least one frame module includes a plurality of frame modules constructed and arranged in an array, and wherein the power management system further comprises one or more communication elements for establishing a communication between the power, cooling, and control connectors of each of the frame modules.

3. The power management system of claim 1, wherein each of a plurality of the at least one power conversion units has a same configuration.

4. The power management system of claim 1, further comprising a blindmate connector set that includes an interface between at least one of the first connectors and at least one of the second connectors.

5. The power management system of claim 4, wherein the interface of the blindmate connector set is at a rear portion of the at least one frame module.

6. The power management system of claim 1, wherein the at least one power conversion unit performs power conversion, inversion, rectification, or a combination thereof.

7. The power management system of claim 1, wherein the at least one power conversion unit comprises a power conversion module, a capacitor bank, an inductor bank, and a switching module.

8. The power management system of claim 7, wherein the power conversion module includes the plurality of first connectors, the first connectors including at least one direct current (DC) power connector, at least one alternate current (AC) power connector, a control connector, a coolant connector, an alignment pin, or a combination thereof.

9. The power management system of claim 7, wherein the switching module communicates with a central controller that can process information received from a plurality of the at least one power conversion units.

10. The power management system of claim 1, wherein the high power includes a power range up to 200 kW or greater, and includes a current range of up to 500 amps per connection or more, and an operating voltage range of up to 1100 VDC or up to 690 VAC.

11. A method for delivering power, comprising:
    arranging a plurality of power conversion units in a frame, the frame comprising a plurality of first connectors, the power conversion units each comprising a plurality of second connectors;
    simultaneously connecting the plurality of second connectors respectively to a first connector of the plurality of first connectors by applying a force against each of the plurality of power conversion units using a cam assembly disposed on each of the power conversion units to move each of the power conversion units in a direction of the first connectors, wherein the first and second connectors include a combination of high power, cooling, and control connectors.

12. The method of claim 11, further comprising forming a blindmate connector interface between at least one of the first connectors and at least one of the second connectors.

13. The method of claim 11, wherein the first connectors include at least one direct current (DC) power connector, at least one alternate current (AC) power connector, a control connector, a coolant connector, an alignment pin, or a combination thereof.

14. The method of claim 11, wherein the power conversion unit includes a switching module that communicates with a central controller that can process information received from a plurality of the at least one power conversion units.

15. The method of claim 11, wherein the high power includes a power range up to 200 kW or greater, and includes a current range of up to 500 amps per connection or more, and an operating voltage range of up to 1100 VDC or up to 690 VAC.

* * * * *